(12) United States Patent
Cai et al.

(10) Patent No.: US 8,591,990 B2
(45) Date of Patent: Nov. 26, 2013

(54) MICROFIBER SUPPORTED METAL SILICIDE NANOWIRES

(75) Inventors: Mei Cai, Bloomfield Hills, MI (US); Xueliang Sun, London (CA); Yong Zhang, London (CA); Mohammad Norouzi Banis, London (CA); Ruying Li, London (CA)

(73) Assignees: GM Global Technology Operations LLC, Detroit, MI (US); The University of Western Ontario, London, Ontario (CA)

( * ) Notice: Subject to any disclaimer, the term of this patent is extended or adjusted under 35 U.S.C. 154(b) by 286 days.

(21) Appl. No.: 13/071,552

(22) Filed: Mar. 25, 2011

(65) Prior Publication Data

US 2012/0241192 A1    Sep. 27, 2012

(51) Int. Cl.
*B05D 7/00*      (2006.01)
*B82Y 40/00*     (2011.01)
*C30B 29/06*     (2006.01)
*C30B 29/62*     (2006.01)

(52) U.S. Cl.
USPC ...... 427/255.11; 977/754; 977/848; 427/113; 427/126.1; 427/249.15; 427/74; 427/255.27; 427/255.31; 427/255.37; 427/212; 427/214; 427/215; 427/216; 427/217; 427/219; 204/192.17; 204/192.15; 204/298.24

(58) Field of Classification Search
USPC ................................. 977/754, 848
See application file for complete search history.

(56) References Cited

U.S. PATENT DOCUMENTS

2012/0219860 A1*   8/2012   Wang et al. ................... 429/220

* cited by examiner

*Primary Examiner* — Timothy Meeks
*Assistant Examiner* — Mandy Louie
(74) *Attorney, Agent, or Firm* — Reising Ethington P.C.

(57) ABSTRACT

An arrangement of elongated nanowires that include titanium silicide or tungsten silicide may be grown on the exterior surfaces of many individual electrically conductive microfibers of much larger diameter. Each of the nanowires is structurally defined by an elongated, centralized titanium silicide or tungsten silicide nanocore that terminates in a distally spaced gold particle and which is co-axially surrounded by a removable amorphous nanoshell. A gold-directed catalytic growth mechanism initiated during a low pressure chemical vapor deposition process is used to grow the nanowires uniformly along the entire length and circumference of the electrically conductive microfibers where growth is intended. The titanium silicide- or tungsten silicide-based nanowires can be used in a variety electrical, electrochemical, and semiconductor applications.

18 Claims, 5 Drawing Sheets

MICROFIBER SUPPORTED METAL SILICIDE NANOWIRES

TECHNICAL FIELD

The technical field of this disclosure relates generally to microfiber-supported nanowires that include titanium silicide or tungsten silicide. Each of the nanowires is structurally defined by an elongated, centralized titanium silicide or tungsten silicide nanocore that terminates in a distally spaced gold particle and which is co-axially surrounded by a removable amorphous nanoshell. A gold-directed catalytic growth mechanism initiated during a low pressure chemical vapor deposition process is used to grow the nanowires uniformly along the entire length and circumference of many individual electrically conductive microfibers where growth is intended. Several physical properties of the nanowires can be selectively influenced by one or more controllable operating parameters associated with their growth.

BACKGROUND

Transition metal silicides are a class of semiconductor refractory materials. They are most commonly used by the microelectronics industry to fabricate silicon integrated circuits. These materials have recently found much broader applications owing to their electrical conductivity, general chemical inertness, and low work function. For instance, in nanostructure form, transition metal silicides are considered promising candidates to serve as building blocks in the construction of electronic and electrochemical component parts in which dimensional size reductions are constantly sought that preserve certain performance characteristics (i.e., current density, charge/discharge capacity, energy density).

Nanowires fabricated from a transition metal silicide have recently been the subject of much research. A variety of transition metal silicide nanowires have been developed including those with Ti, V, Cr, Mn, Fe, Co, Ni, Cu, Au, Pt, Er, or Ta serving as the transition metal constituent. But the techniques used to make these various nanowires have not been able to reliably, controllably, and precisely fabricate the nanowires in a way that makes their incorporation into electronic devices and electrochemical cells a viable option.

Nanowires comprised of titanium silicide or tungsten silicide are especially intriguing prospects for a wide variety of applications due to their relatively high electrical conductivity, excellent chemical and thermal stability, and corrosion resistance. Their very small size and general physical properties make them particularly attractive for select purposes in electrochemical cells that are used to power automobiles, consumer electronics, and other mobile or stationary devices. A network or collection of many individual electrically conductive microfibers each having a relatively dense circumferential arrangement of surface-bound titanium silicide- or tungsten silicide-based nanowires may, for example, be substituted for finely divided carbon or graphite particles that are commonly dispersed and bound within fuel cell or lithium-ion battery electrode layers. Other applications in electronics (e.g., field emission devices), optoelectronics (e.g., light emitting diodes), photovoltaics (e.g., solor energy devices), and electrochemical devices (e.g., supercapacitors and emitters) may also suit such electrically conductive microfiber collections in some way or another.

But, like the other nanowire forms, a suitable method that can produce a relatively dense quantity of spatially arranged titanium silicide- or tungsten silicide-based nanowires on a microfiber support has not previously been developed. Methods of reliably and controllably growing spatially arranged titanium silicide- and tungsten silicide-based nanowires on the surface of electrically conductive microfibers are therefore needed to further develop the realm of practical applications for these types of metal silicide nanowires.

SUMMARY OF THE DISCLOSURE

An arrangement of elongated nanowires that include titanium silicide or tungsten silicide may be grown on the exterior surfaces of many individual electrically conductive microfibers of much larger diameter. The relatively small nanowires are uniformly anchored along the exterior surfaces of the electrically conductive microfibers and, as such, protrude outwardly in all directions around the circumference of the microfibers to provide a wealth of flexible surface extensions. The final length and diameter dimensions of the surface-grown nanowires are substantially the same although they may grow at different rates. The titanium silicide or tungsten silicide contained in the nanowires imparts very favorable characteristics to the nanowires including electrically conductivity, thermally stability, and oxidation and corrosion resistance.

Each of the surface-bound nanowires is composed of an elongated, centralized titanium silicide or tungsten silicide nanocore that terminates at a distally spaced gold particle. The titanium silicide and tungsten silicide crystal phases that primarily constitute the nanocores are $Ti_5Si_3$ and $WSi_2$ or $W_5Si_3$, respectively. The gold particle is a remnant of the nanowire growth process. Both the titanium silicide or tungsten silicide nanocore and the terminal gold particle are optionally co-axially surrounded by an amorphous nanoshell. The surrounding nanoshells are generally composed of silicon oxide or an inorganic carbon-based mixture of carbon, silicon, and oxygen. The nanoshells may be significantly stripped or altogether removed from the nanocores, if desired, by etching in a corrosive acid or any other suitable process. The removal of the amorphous nanoshells decreases the diameter of the nanowires, increases the electrical conductivity of the nanowires, and improves the capacitance behavior of the nanowires. The term "silicide nanowires" is sometimes used in this disclosure to generally identify the nanowires and all their possible structural variations for the sake of brevity; it is intended to encompass nanowires that include either a titanium silicide or tungsten silicide nanocore both with and without the surrounding amorphous nanoshell.

The physical and chemical properties of the silicide nanowires make the electrically conductive microfibers with their surface-grown silicide nanowire arrangements suitable options for a wide variety of electronic and electrochemical cell applications. In the construction of fuel cell and lithium ion battery electrode layers, for example, a large quantity of carbon microfibers numbering in the hundreds to tens of thousands can be arranged into a fibrous collection in which the vast number of surface grown nanowires on adjacent or intertwined microfibers ensnare and engage one another. The engaged nanowires collectively reduce the surface electrical contact resistance between the individual microfibers. The network of diffusible crevices formed between the engaged nanowires, moreover, can support active catalyst particles (i.e., platinum in a fuel cell electrode catalyst layer) as well as intercalated lithium ions (i.e., lithium ion battery electrode). Thin, polymer-bound layers of the fibrous collection can thus be substituted for some or all of the carbon and graphite materials commonly used to construct fuel cell anode and cathode catalyst layers and lithium ion battery negative electrode layers. Many other uses for the electrically conductive microfiber-bound silicide nanowires exist as well.

The silicide nanowires are grown on the exterior surfaces of a collection of electrically conductive microfibers by a gold-directed catalytic growth mechanism initiated during a low pressure chemical vapor deposition process. A thin-film layer of pure titanium or pure tungsten, depending on the desired silicide composition of the elongated nanocores, is initially deposited over the exterior surfaces of the individual electrically conductive fibers to a preferred thickness of about 500 nm to about 2 µm. A thin-film layer of pure gold is then deposited over the exterior surface of the titanium or tungsten thin-film layer to a preferred thickness of about 1 nm to about 10 nm. Both the titanium or tungsten thin-film layer and the gold thin-film layer are preferably applied by magnetron sputtering. After the two metallic layers (Ti/W and Au) have been deposited, the electrically conductive microfibers are subjected to a low pressure chemical vapor deposition process where they are exposed to silicon vapors in a low pressure, heated, and inert deposition chamber. The deposition chamber is preferably maintained at atmospheric pressure or below, down to about 500 Torr, and a temperature of about 600° C. to about 900'C.

The silicon vapors are derived from a reactive gas mixture that includes a silicon source and an inert carrier gas. Other materials may also be included in the reactive gas mixture. Hydrogen or some other suitable gas may be included in the reactive gas mixture to react with the silicon source gas to produce the silicon vapors. An alkene gas may additionally be included in the reactive gas mixture to induce the growth of nanoshells that are composed of the inorganic carbon-based mixture of carbon, silicon, and oxygen as opposed to silicon oxide. A preferred alkene gas for such a purpose is ethylene. Suspended fine-powder particles of titanium or tungsten (whichever metal is being used to form the nanowires) may also be added to the reactive gas mixture just upstream of the electrically conductive microfibers in the deposition chamber. The distance at which the titanium/tungsten fine-powder particles are added to the reactive gas mixture, relative to the electrically conductive microfibers, affects the diameter of the silicide nanowires and, at a particular distance or greater, causes very small branched tentacles to form on the surfaces of the silicide nanowires in all directions. The branched tentacles measure several nanometers to several tens of nanometers in length, and are compositionally the same (nanocore and nanoshell) as the silicide nanowires that support them.

The silicide nanowires are believed to be grown on the exterior surfaces of the electrically conductive microfibers by a gold-directed vapor-liquid-solid (VLS) growth mechanism. This theory supposes that an interfacial reaction between the silicon vapors and the thin-film gold layer initiates the formation of nucleated liquid phase alloy seeds that contain gold, titanium or tungsten, and silicon. Gold and silicon are introduced into the nucleated liquid phase alloy seeds as a result of the low-temperature eutectic point of gold and silicon alloys. The mechanism by which titanium or tungsten infiltrate the nucleated liquid phase alloy seeds despite their relatively high melting points (well above the 600° C. to 900° C. temperature rang of the deposition chamber) is not entirely understood. The titanium or tungsten thin-film layer may gradually dissolve into the energetically favored and easily produced gold-silicon droplets or it may react with other species contained in the deposition chamber to form a titanium- or tungsten-containing vapor that is absorbed by the gold-silicon droplets.

The nucleated liquid phase alloy seeds absorb silicon (from the silicon vapors) and titanium or tungsten (from the titanium or tungsten thin-film layer) to supersaturation levels which, in turn, provokes precipitation of titanium silicide or tungsten silicide crystal phase precipitates. The crystallized titanium or tungsten silicide precipitates self-assemble, over time, into the titanium silicide or tungsten silicide nanocores and grow outwardly from the exterior surface of the electrically conductive microfibers. The outward growth of the titanium silicide or tungsten silicide nanocores is accompanied by the simultaneous and natural growth of the surrounding amorphous nanoshells. The natural growth of the nanoshells is likely attributed to the absorption of gaseous species contained in the deposition chamber by the nucleated liquid phase alloy seeds along with the silicon vapors. The absorption of residual oxygen species causes the nanoshells to be primarily composed of silicon oxide. The absorption of residual oxygen species and carbon species causes the nanoshells to be primarily composed of the inorganic carbon-based mixture of carbon, silicon, and oxygen. The residual oxygen species may be residually present in the deposition chamber or unintentionally introduced into the deposition chamber as part of the reactive gas mixture. The carbon species may be introduced into the deposition chamber by including the alkene gas in the reactive gas mixture.

The nucleated liquid phase alloy seeds provide a locally consumable source of titanium/tungsten and silicon at the growing end of the titanium silicide or tungsten silicide nanocores. They nourish growth of the titanium silicide or tungsten silicide nanocores and, ultimately, the nanowires, until at least one of the titanium/tungsten or silicon is sufficiently diminished. The exhausted nucleated liquid phase alloy seeds are comprised mainly of gold and small titanium/tungsten and silicon impurities, and settle near the tips of the titanium or tungsten silicide nanocores as the terminal gold particle remnants. The many individual nanowires that are catalytically grown in this manner under the same conditions exhibit substantially the same length and diameter dimensions even though they may not necessarily be grown at the same rate. The uniform thickness of the titanium or tungsten thin-film layer deposited on the electrically conductive microfibers most likely promotes this result.

A preferred embodiment of the low pressure chemical vapor deposition process involves positioning the electrically conductive microfibers (with their titanium/tungsten and gold thin-film layers already applied) in a quartz housing that defines a deposition chamber. The deposition chamber is purged with argon and then heated by a surrounding furnace to a temperature between about 600° C. and about 900° C. The pressure inside the deposition chamber is maintained at or around atmospheric pressure. The reactive gas mixture that contributes the silicon vapors is then introduced into the deposition chamber. The reactive gas mixture includes effective amounts of argon, silicon chloride, and hydrogen. The silicon chloride and hydrogen react at the elevated temperature maintained in deposition chamber to form the silicon vapors. A preferred volumetric flow of the reactive gas mixture into the deposition chamber, per about 400 sccm (standard cubic centimeters per minute), is about 200 to about 240 sccm Ar, about 200 to about 160 sccm $H_2$, and a quantity of $SiCl_4$ that is managed by diverting up to about 3 vol %, more preferably about 0.2 to about 1.5 vol. %, of the argon flow through a liquid solution of substantially pure silicon chloride ($SiCl_4$ purity of greater than 99%). The reactive gas mixture may also include an effective amount of ethylene and/or very-fine suspended titanium or tungsten powder. Ethylene is added to promote the formation of inorganic carbon-based nanoshells, and is preferably added to the previously-described 400 sccm Ar/$H_2$/$SiCl_4$ gas mixture at about 1 to about 10 sccm. The suspended titanium or tungsten powder may be added to induce the formation of branched tentacles on the exterior of the silicide nanowires.

Several properties of the surface-grown silicide nanowires may be selectively influenced by one or more controllable operating parameters associated with their growth. The density of the silicide nanowires can be influenced by varying the thickness of the thin-film gold layer and the amount of silicon chloride contained in the reactive gas mixture. The length and diameter of the silicide nanowires can be influenced by the thickness of the titanium or tungsten thin-film gold layer, the amount of silicon chloride contained in the reactive gas mixture, and the length of time in which the electrically conductive microfibers are exposed to the silicon vapors. The diameter and morphology of the silicide nanowires can be influenced by the presence of the suspended titanium or tungsten powder particles in the reactive gas mixture sample. And finally, the composition of the nanoshells, if retained, can be influenced by the contents of the reactive gas mixture. These various parameters may be individually or collectively varied to provide some manageable flexibility in the manufacture of electrically conductive microfibers with surface-grown silicide nanowire arrangements.

BRIEF DESCRIPTION OF THE DRAWINGS

FIGS. 6b-6d show the EDX spectra of various portions of the titanium silicide-based nanowire shown in FIG. 6a.

FIGS. 9a-9b show the nanowires that were produced when the titanium powder particle sample was placed about 1 cm upstream from the Ti/Au coated carbon microfibers. FIGS. 9c-9d show the nanowires that were produced when the titanium powder particle sample was moved back from the Ti/Au coated carbon microfibers to about 2 cm.

DETAILED DESCRIPTION OF PREFERRED EMBODIMENTS

A relatively high density arrangement of outwardly protruding nanowires that each comprise titanium silicide or tungsten silicide can be formed on the surface of many individual electrically conductive microfibers. The silicide nanowires are structurally defined by a co-axial construction in which a titanium silicide or tungsten silicide nanocore that terminates in a distally spaced gold particle is surrounded by a removable amorphous nanoshell. A gold-directed catalytic growth mechanism initiated during a low pressure chemical vapor deposition process is used to grow the silicide nanowires uniformly along the entire length and circumference of the electrically conductive microfibers where growth is intended. The many individually grown silicide nanowires also exhibit substantially the same length and diameter dimensions despite the fact that they may grow at different rates.

Figure 1:
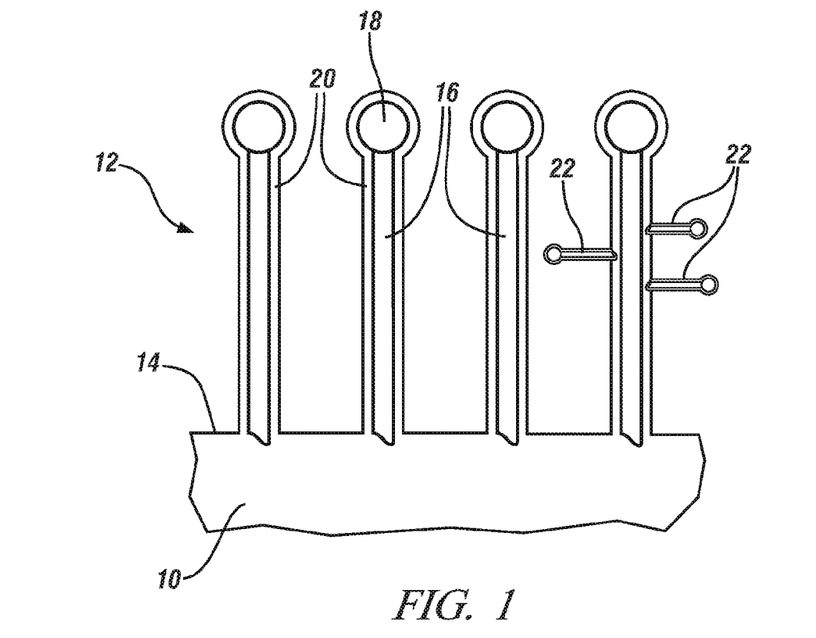
FIG. 1 is a magnified, idealized illustration of a portion of a single electrically conductive microfiber having several catalytically grown silicide nanowires protruding from an exterior surface of the microfiber.

FIG. 1 depicts a magnified, idealized illustration of a portion of an electrically conductive microfiber 10 having several catalytically grown silicide nanowires 12 protruding from an exterior surface 14 of the microfiber 10. The silicide nanowires 12 are grown coextensively along and integrally fused to the exterior surface 14. This spatial arrangement of anchored silicide nanowires 12 can best be described as a relatively dense surface compilation of flexible filaments that uniformly populate and extend from the exterior surface 14 of the electrically conductive microfiber 10 along its length and circumference. The length and diameter of the electrically conductive microfiber 10 can vary widely depending on the particular end-use application but, in general, range from about 10 μm to 2 mm and about 1 μm to 50 μm, respectively. It should be noted that the electrically conductive microfiber 10 shown here is part of a larger collection of similar electrically conductive microfibers (i.e., hundreds to tens of thousands) having similar surface-grown silicide nanowires.

The silicide nanowires 12 include an elongated, centralized nanocore 16 composed of titanium silicide or tungsten silicide. The nanocore 16 protrudes from the exterior surface 14 of the electrically conductive microfiber 10 and terminates at a gold particle 18 that is distally spaced from the exterior surface 14. The primary titanium silicide and tungsten silicide crystal phases found in the nanocore 16 are, respectively, $Ti_5Si_3$ and $WSi_2$ or $W_5Si_3$. The terminally-located gold particle 18 is a residual consequence of the gold-directed catalytic growth mechanism employed to grow the silicide nanowires 12 from the exterior surface 14, as explained below. Both the titanium silicide or tungsten silicide nanocore 16 and the gold particle 18 may be co-axially encased by an amorphous nanoshell 20 composed of silicon oxide or an inorganic carbon-based mixture of carbon, silicon, and oxygen. The nanoshell 20 is naturally formed during growth of the silicide nanowires 12 but may be removed by any suitable technique such as etching in a corrosive acid. Moreover, if desired, a plurality of branched tentacles 22 that transversely stem from the silicide nanowire 12 can be fabricated. The branched tentacles 22 are compositionally the same (nanocore, residual gold particle, nanoshell) as the rest of silicide nanowire 12 from which they emanate.

The length and diameter of the silicide nanowires 12 are much smaller than the electrically conductive microfiber 10. The silicide nanowires 12 typically range from about 1 μm to 10 μm, in length, and about 20 nm to 100 nm, in diameter. Within these length and diameter ranges, moreover, there exists very little deviation amongst the many individual silicide nanowires 12 grown on the exterior surface 14 of the electrically conductive microfiber 10; rather, the bulk of the silicide nanowires 12 exhibit substantially the same length and diameter dimensions. No more than a 10% variance in these two dimensions is expected to materialize between individual silicide nanowires 12 that are catalytically grown under similar process circumstances. The branched tentacles 22, if present, typically range from about 5 nm to about 100 nm in length and about 10 angstroms to about 2 nm in diameter.

Several properties of the silicide nanowires 12 can be selectively influenced by one or more controllable operating parameters associated with their growth. Some of these properties include, for example, the density of the silicide nanowires 12 grown on the exterior surface 14 of the electrically conductive microfiber 10, the length, diameter, and morphology (presence of the branched tentacles 22) of the silicide nanowires 12, and the composition and thickness of the nanoshells 20, to name but a few. The nanoshells 20 that encase the titanium silicide or tungsten silicide nanocores 16 may also be significantly stripped or altogether removed by subsequent processing, as already mentioned. Stripping or removing the nanoshells 20 may be appealing if a decrease in the diameter and/or the electrical contact resistance of the silicide nanowires 12 would be deemed advantageous.

The silicide nanowires 12 have a wide variety of potential applications. A large quantity of the electrically conductive microfibers 10 having surface-bound arrangements of the silicide nanowires 12 may be substituted for finely divided carbon or graphite particles that are commonly used to construct, for example, fuel cell electrode layers (both the anode and cathode catalyst layers) and lithium-ion battery electrode layers (the negative electrode layer). The electrically conductive microfibers 10 are preferably formed of carbon black, activated carbon, vitreous carbon, or graphite (collectively "carbon") for such applications. The carbon microfibers can be arranged into a fibrous collection in which the vast number of surface grown silicide nanowires 12 on adjacent or intertwined carbon microfibers engage and ensnare one another. The engaged silicide nanowires 12 collectively reduce the surface electrical contact resistance between the individual carbon microfibers. The network of diffusible crevices formed between the engaged silicide nanowires 12, moreover, can support active catalyst particles (i.e., platinum in a fuel cell electrode catalyst layer) as well as intercalated lithium ions (i.e., lithium ion battery electrode). A thin polymer-bound layer of intertwined carbon microfibers that sustain relatively dense surface arrangements of the silicide nanowires 12 would likely provide the desired balance of electrical conductivity, chemical and thermal stability, and high-surface area needed to ensure the fuel cell or lithium-ion battery electrode layer functions properly.

The fibrous collection of carbon microfibers can be loaded with an appropriate amount of fine catalyst particles and bound within an ionomeric binder to prepare a proton exchange membrane (PEM) fuel cell catalyst layer. The many silicide nanowires 12 anchored to the individual carbon microfibers support the fine catalyst particles and provide a vast interconnected architecture that promotes electron movement and three-phase-interaction between a fuel gas (i.e., hydrogen), the catalyst particles, and the ionomeric binder during PEM fuel cell operation. The silicide nanowires 12 are also thermally and chemically stable. These several desirable characteristics allow the silicide nanowires 12 to carry out the core functions of both a PEM fuel cell anode and cathode catalyst layer despite the corrosive operating environment normally encountered.

A PEM fuel cell electrode that incorporates the silicide nanowires 12 as a catalyst support can be prepared by any known process. One particularly common process involves loading the fine catalyst particles onto the carbon microfiber-sustained silicide nanowires 12 by wet incipient impregnation and, afterwards, dispersing the carbon microfibers into a liquid catalyst ink solution that includes the ionomeric binder and a solvent. The liquid catalyst ink solution can then be cast or otherwise applied onto a gas diffusion media structure or a polymer electrolyte membrane and dried to form either the anode or cathode catalyst layer. The fine catalyst particles supported on the silicide nanowires 12 are preferably those of platinum or a platinum alloy. The ionomeric binder is preferably a sulfonated perfluoropolymer such as Nafion® (DuPont) or Flemion® (Asashi Glass).

The fibrous collection of carbon microfibers can be bound within a binder material to prepare a lithium-ion battery negative electrode layer. The silicide nanowires 12 are thought to provide relatively rapid lithium intercalation and de-intercalation capabilities as well as relatively high and sustainable lithium charge and discharges rates. Other nanostructured forms of titanium silicide, for instance, have demonstrated charge and discharge capacities in excess of 600 mAh/g and 500 mAh/g, respectively, even after 30 charge/discharge cycles. The electrically conductive nature of the silicide nanowires 12 also promotes electron collection and transport during operation of a lithium-ion battery. The binder material used to prepare the negative electrode is generally a polymer that can interact with the electrolyte solution present at the interface between the negative electrode layer and the adjacent contacting separator through which the lithium ions migrate. Some examples of suitable binder materials include polyvinyldiene fluoride (PVdF), an ethylene propylene diene monomer (EPDM) rubber, and carboxymethoxyl cellulose (CMC). Any suitable process may be employed to construct the negative electrode layer from the fibrous collection of carbon microfibers.

Figure 2:
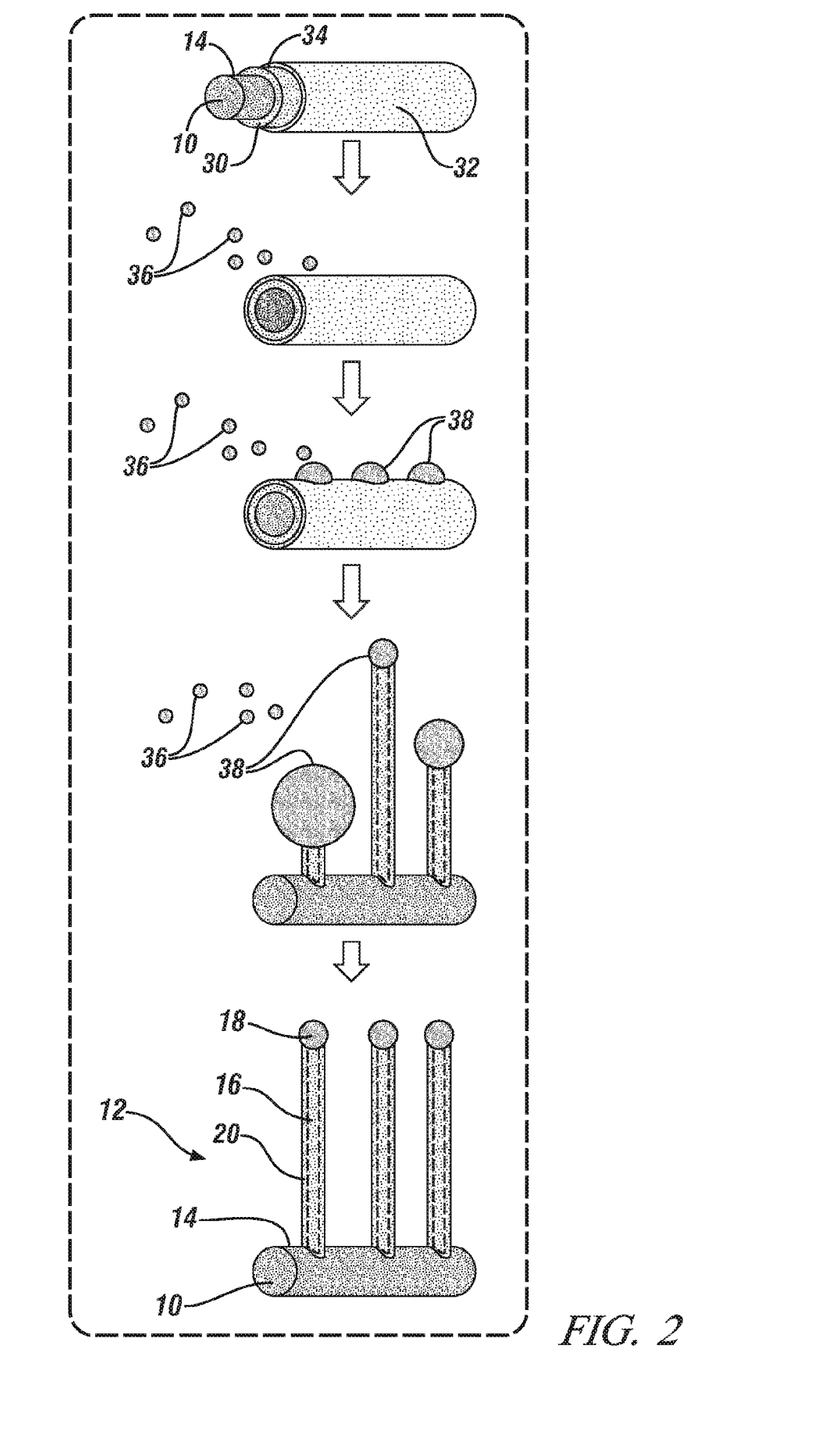
FIG. 2 is a schematic and generalized diagram that shows the method by which the silicide nanowires shown in FIG. 1 are catalytically grown on the electrically conductive microfiber.

The method for catalytically growing the silicide nanowires 12 on the exterior surface 14 of the electrically conductive microfiber 10 is shown generally and schematically in FIG. 2. This method is normally practiced simultaneously on a collection of electrically conductive microfibers often numbering in the hundreds to tens of thousands, as previously intimated, although only a single electrically conductive microfiber 10 having several surface-grown silicide nanowires 12 is shown and described here for the sake of simplicity. The silicide nanowires 12 are believed to be grown by a gold-directed vapor-liquid-solid (VLS) growth mechanism that is initiated during a low-pressure chemical vapor deposition process.

To begin, a thin-film layer 30 of pure (>99.9%) titanium or tungsten is deposited onto the exterior surface 14 of the electrically conductive microfiber 10. The choice between titanium and tungsten determines whether the nanocores 16 are composed of titanium silicide or tungsten silicide. The thickness of the titanium or tungsten thin-film layer 30 preferably ranges from about 500 nm to about 2 μm, and has a directly proportional effect on the length and diameter of the nanowires 12 that are ultimately grown. A thin-film layer 32 of pure (>99.9%) gold is then deposited over the exterior surface 34 of the titanium or tungsten thin-film layer 30. The thickness of the gold thin-film layer 32 preferably ranges from about 1 nm to about 10 nm. The size and thickness of the electrically conductive fiber 10, the titanium or tungsten thin-film layer 30, and the gold thin-film layer 32, as shown in FIG. 2, are not drawn to scale or meant to convey relative size or thickness proportions. FIG. 2 is intended only to conceptually demonstrate the layered relationship between the electrically conductive microfiber 10 and its two overlying metallic thin-film layers 30, 32.

The electrically conductive microfiber 10 with its surface deposited metallic layers 30, 32 is then exposed to silicon vapors 36 in a deposition chamber that maintains a heated, low pressure, and inert environment (i.e., low pressure chemical vapor deposition). The silicon vapors 36 are derived from a reactive gas mixture that is introduced into the deposition chamber. The pressure in the deposition chamber ranges from atmospheric pressure to slightly below atmospheric pressure, preferably from about 760 Torr down to about 500 Torr. The temperature in the deposition chamber preferably ranges from about 600° C. to about 900° C.

The reactive gas mixture contains an inert carrier gas and a silicon source that can supply or be reacted to supply the silicon vapors 36. The reactive gas mixture may also include hydrogen, an alkene gas, and/or suspended titanium or tungsten fine powder particles. The hydrogen may be added to react with the silicon source to generate the silicon vapors 36. The alkene gas may be added to induce the growth of nanoshells 20 that are composed of the inorganic carbon-based mixture of carbon, silicon, and oxygen as opposed to silicon oxide. A preferred alkene gas for such a purpose is ethylene. The suspended titanium or tungsten fine-powder particles may be added to the reactive gas mixture in the deposition chamber at a particular distance upstream from the electrically conductive microfiber 10 to fabricate the branched tentacles 22.

The interaction between the silicon vapors 36 and the overlying metallic layers 30, 32 initiates the formation of nucleated liquid phase alloy seeds 38 that contain gold, titanium or tungsten, and silicon. The mechanism by which titanium or tungsten participate in the VLS growth process and infiltrate the nucleated liquid phase alloy seeds 38, despite their relatively high melting points compared to the current heated environment, is not entirely understood. The titanium or tungsten thin-film layer 30 may gradually dissolve into the more energetically favored and easily produced gold-silicon droplets or it may react with other immediately present species (i.e., chloride species) contained in the deposition chamber to form a titanium- or tungsten-containing vapor that is absorbed by the gold-silicon droplets.

The nucleated liquid phase alloy seeds 38 absorb silicon (from the silicon vapors) and titanium or tungsten (from the titanium or tungsten thin-film layer 30) to supersaturation levels which, in turn, provokes precipitation of titanium silicide or tungsten silicide crystal phase precipitates. The crystallized titanium or tungsten silicide precipitates self-assemble, over time, into the elongated titanium silicide or tungsten silicide nanocores 16 and grow outwardly from the exterior surface 14 of the electrically conductive microfiber 10. The outward growth of the titanium or tungsten silicide nanocores 16 is accompanied by the simultaneous growth of the surrounding and naturally-forming amorphous nanoshells 20. The natural growth of the nanoshells 20 is likely attributed to the absorption of gaseous species, in addition to silicon, by the nucleated liquid phase alloy seeds 38. The absorption of residual oxygen species causes the nanoshells 20 to be primarily composed of silicon oxide while the absorption of residual oxygen and carbon species causes the nanoshells 20 to be primarily composed of the inorganic carbon-based mixture of carbon, silicon, and oxygen. The residual oxygen species may be unintentionally introduced into the deposition chamber as part of the reactive gas mixture or it may be residually present in the deposition chamber. The carbon species may be introduced into the deposition chamber by adding the alkene gas to the reactive gas mixture.

The nucleated liquid phase alloy seeds 38 remain near the divergently growing end of the titanium or tungsten silicide nanocores 16 during growth to provide a locally consumable source of titanium/tungsten and silicon. The outward growth of the nanowires 10 (titanium or tungsten silicide nanocores 16 and surrounding amorphous nanoshells 20) eventually subsides when at least one of the titanium/tungsten or silicon contained in the nucleated liquid phase alloys seeds 38 is sufficiently diminished. The spent nucleated liquid phase alloy seeds 38, which are comprised mainly of gold with small titanium/tungsten and silicon impurities, settle near the tip of the titanium silicide or tungsten silicide nanocores 16 as the gold particle 18. The many individual nanowires 12 that are catalytically grown in this manner exhibit substantially the same length and diameter dimensions even though they may not necessarily be grown at the same rate. This result is likely attributed to the generally uniform thickness of the applied titanium or tungsten thin-film layer 30.

Figure 3:
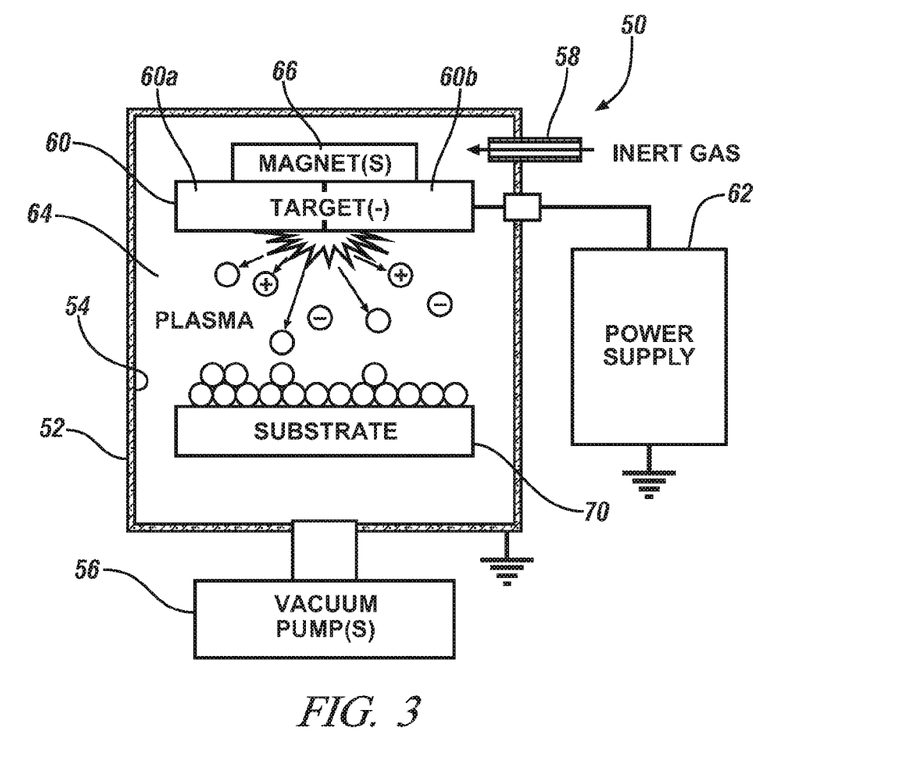
FIG. 3 is a schematic illustration of a magnetron sputtering assembly that may be used to accomplish the method depicted in FIG. 2.
Figure 4:
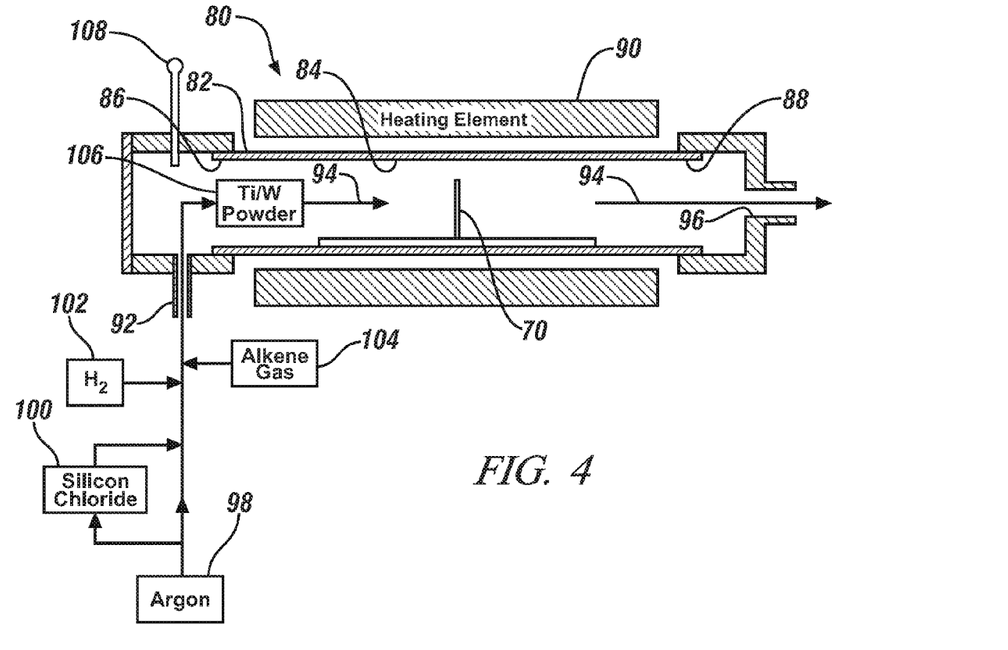
FIG. 4 is a schematic illustration of a low pressure chemical vapor deposition assembly that may be used to accomplish the method depicted in FIG. 2.

FIGS. 3 and 4 schematically illustrate a magnetron sputtering assembly 50 and a low pressure chemical vapor deposition assembly 80, respectively, that may be used to carry out the method just described with reference to FIG. 2. The magnetron sputtering assembly 50 applies the titanium or tungsten thin-film layer 30 and the gold thin-film layer 32 onto the electrically conductive microfiber 10. The low pressure chemical vapor deposition assembly 80 exposes the electrically conductive microfiber 10 and its overlying metallic layers 30, 32 to the silicon vapors 36 in an appropriate heated and low pressure environment that is conducive to formation of the nucleated liquid phase alloy seeds 38 and growth of the silicide nanowires 12.

The magnetron sputtering assembly 50 (FIG. 3) includes a housing 52 that defines a sputtering chamber 54. A vacuum pump 56 (or pumps) and an inert gas feed conduit 58 are fluidly associated with the sputtering chamber 54. The vacuum pump 56 performs the dual function of removing air from the sputtering chamber 54 and reducing the pressure of the sputtering chamber 54 to its prescribed sputtering pressure. The pressure maintained in the sputtering chamber 54 during sputtering is usually well below atmospheric levels. The inert gas feed conduit 58 introduces an inert gas, usually argon, into the sputtering chamber 54 after the vacuum pump 56 has lowered the chamber's 54 pressure.

The sputtering chamber 54 encloses a target 60. The target 60 is a planar, tubular, or other appropriately shaped metal stock component composed of the particular metal intended to be deposited. Pure titanium or tungsten, whichever is desired to form the nanocores 16, is employed to deposit the titanium or tungsten thin-film layer 30 and pure gold is employed to deposit the gold thin-film layer 32. The target 60 is connected to a power supply 62. The power supply 62 applies a negative charge to the target 60, when activated, and is preferably a radio frequency (RF) generator. The strong negative charge applied to the target 60 ionizes the surrounding inert gas and forms a plasma region 64 that includes free electrons. A magnet 66 (or a series of magnets) precisely positioned near or within the target 60 provides a magnetic field that concentrates the plasma region 64 close to the target 60 where its ionizing capability is more pronounced.

The crowded electrons present in the plasma region 64 continuously collide with other inert gas particles to generate cations and more free electrons. The newly generated cations are then immediately accelerated towards the negatively charged target 60 at a very high velocity. The resultant high-energy collisions eject very small, atom-sized metal particles from the target 60 (i.e., sputtering). These metal particles can be condensed and deposited onto another surface as a very thin, precise, and uniform metal layer. The sometimes high quantities of heat generated at the target 60 during sputtering are normally removed by either a continuous flow of cooling water behind the target 60 or a reservoir of cooling water contained within the target 60.

In operation, a microfiber substrate collection 70 having hundreds to tens of thousands of the electrically conductive microfibers 10 is positioned inside the sputtering chamber 54 in spaced relation to the target 60. The target 60, as shown, includes a titanium/tungsten target segment 60a and a gold target segment 60b. The titanium/tungsten target segment 60a includes either pure titanium or pure tungsten depending on the desired composition of the silicide nanowires 12 being formed. The two target segments 60a, 60b can be selectively activated by the power supply 62 when needed. Once the microfiber substrate collection 70 is sealed within the sputtering chamber 54, the vacuum pump(s) 56 is activated. The pressure in the sputtering chamber 54 is lowered, preferably, to between about $2.5 \times 10^{-3}$ Torr to about $8.0 \times 10^{-3}$ Torr and, more preferably, to between about $4.0 \times 10^{-3}$ Torr to about $5.0 \times 10^{-3}$ Torr. Argon gas is then fed into the sputtering chamber 54 through the inert gas feed conduit 58.

Next, after a sufficient quantity of argon is introduced into the sputtering chamber 54, the power supply 60 is activated to deliver a RF power feed to the titanium/tungsten target segment 60a only. This causes the plasma region 64 to form in the vicinity of the titanium/tungsten target segment 60a but not in the vicinity of the gold target segment 60b. The resultant titanium or tungsten atomic particles sputtered from the titanium/tungsten target segment 60a move toward the electrically conductive microfiber substrate collection 70 where they condense onto the exterior surfaces 14 of the many individual electrically conductive microfibers 10 to form the titanium or tungsten thin-film layer 30. The RF power feed to the titanium/tungsten target segment 60a is eventually terminated when the titanium or tungsten thin-film layer 30 reaches the desired thickness.

The thin-film gold layer 32 is then deposited on the exterior surface 34 of the titanium or tungsten thin-film layer 30 now present on the many electrically conductive microfibers 10 by the same process except, now, the power supply 62 is activated to deliver a RF power feed only to the gold target segment 60b. The vacuum pump 56 may also be activated to clear the sputtering chamber 54 and/or additional argon may be introduced into the sputtering chamber 54 before the RF power feed to the gold target segment 60b is commenced, if necessary. It should be noted that the titanium or tungsten thin-film layer 30 and the gold thin-film layer 32 do not have to be deposited in the same magnetron sputtering assembly 70, as shown. They may be sequentially deposited on the microfiber substrate collection 70 in separate magnetron sputtering assemblies for any number of reasons.

The low pressure chemical vapor deposition assembly 80 (FIG. 4) includes a tubular quartz housing 82 that defines a deposition chamber 84. The tubular quartz housing 82 has an inlet end 86 and an outlet end 88 and is closely surrounded by a heating element 90 situated between the inlet end 86 and the outlet end 88. The inlet end 86 communicates with a gas inlet conduit 92 and delivers a reactive gas mixture 94 into the deposition chamber 84. A pump (not shown) draws the reactive gas mixture 94 through the deposition chamber 84 from the inlet end 86 to the outlet end 88. The outlet end 88 includes an exhaust gas conduit 96 through which the reactive gas mixture 94 exits the deposition chamber 84. The heating element 90 manages the temperature within the deposition chamber 84 to ensure the reactive gas mixture 94 behaves as intended to initiate growth of the silicide nanowires 12. The heating element 90 may be a uniform or zoned arrangement of one or more resistance band heaters, a series of heating coils, or a furnace. The pressure inside the deposition chamber 84 is maintained by a conventional pressure control system (not shown) that utilizes feedback from a pressure sensor 108.

The reactive gas mixture 94 introduced into the deposition chamber 84 contains argon (the inert carrier gas), which is fed from an argon source 98, and silicon chloride ($SiCl_4$, the silicon source). The silicon chloride is introduced by bubbling a diverted portion of the argon through a liquid silicon chloride solution 100 of 99% $SiCl_4$ purity or above. The reactive gas mixture 94 also preferably contains hydrogen fed from a hydrogen source 102. The hydrogen and silicon chloride contained in the reactive gas mixture 94 react at the elevated temperatures in the deposition chamber 84 to generate the silicon vapors 36. The amount of argon, silicon chloride, and hydrogen needed in the reactive gas mixture 94 to ensure production of a workable contingent of the silicon vapors 36 can be determined by process optimization or derived from the knowledge of skilled artisans. For example, a preferred volumetric flow of the reactive gas mixture 94 contains, per about 400 sccm (standard cubic centimeters per minute), about 200 to about 240 sccm Ar, about 200 to about 160 sccm $H_2$, and a quantity of $SiCl_4$ that is managed by diverting up to about 3 vol %, more preferably about 0.2 to about 1.5 vol. %, of the argon flow through the liquid silicon chloride solution 100. The reactive gas mixture 94 may also optionally include an alkene gas such as, for example, ethylene, as well as suspended fine-powder titanium or tungsten particles (depending on the metal present in the titanium or tungsten thin film layer 30). The alkene gas is introduced into the reactive gas mixture 94 from an alkene gas source 104 before the reactive gas mixture 94 is supplied to the deposition chamber 84, and is preferably added at about 1 to about 10 sccm per the 400 sccm gas flow of argon, hydrogen, and silicon chloride just mentioned. The suspended titanium or tungsten powder particles are introduced into the reactive gas mixture 94 by passing the reactive gas mixture 94 over or through a titanium or tungsten powder sample 106 situated inside the deposition chamber 84.

The microfiber substrate collection 70, after application of the two thin-film layers 30, 32 by the magnetron sputtering assembly 50, is positioned within the deposition chamber 84. A continuous flow of argon is introduced into the deposition chamber 84 from the gas inlet conduit 92 and removed through the exhaust gas conduit 96 to purge the deposition chamber 84 of air. The heating element 90 is then operated to heat the deposition chamber 84 to between 600° C. and 900° C., preferably around 750° C., and the pressure control system is operated to maintain the pressure inside the deposition chamber at atmospheric pressure or below. After the deposition chamber 84 has been purged and heated, the reactive gas mixture 94 is formed by bubbling a diverted portion of argon (up to 3 vol. %) through the liquid silicon chloride solution 100 and adding hydrogen in the appropriate amount to the argon/silicon chloride gas mixture. The reactant gas mixture 94 is continuously supplied through the deposition chamber 84 from the inlet end 86 to the outlet end 88 for a period of about 1 to about 10 hours. The reactant gas mixture 94 supplies the silicon vapors 36 at the exposed interface of the thin-film gold layer 32 present on the many individual electrically conductive microfibers 10 to induce growth of vast arrangements of similarly-sized silicide nanowires 12. When the growth of the silicide nanowires 12 is complete, the heating element 90 is turned off and the feeds of hydrogen and silicon chloride into the reactive gas mixture 94 are terminated. A flow of argon through the deposition chamber 84, however, is maintained until the deposition chamber 84 cools to room temperature.

The silicide nanowires 12, as previously discussed, are believed to be formed on the numerous electrically conductive microfibers 10 contained in the microfiber substrate collection 70 by a gold-directed VLS growth mechanism. The silicon vapors 36 introduced into the deposition chamber 84 interact with the thin-film gold layer 32 carried on the electrically conductive microfibers 10. This interaction forms a very large and uniformly distributed quantity of the nucleated liquid phase alloy seeds 38 over the entire surface of microfibers 10 due to the low eutectic point of gold-silicon alloys. The nucleated liquid phase alloy seeds 38 absorb and condense the silicon vapors 36 and, additionally, dissolve titanium or tungsten directly from the titanium or tungsten thin-film layer 30 or absorb and condense those metals through a titanium chloride or tungsten chloride vapor state. The nucleated liquid phase alloy seeds 38 eventually become supersaturated with titanium/tungsten and silicon and begin to precipitate titanium silicide or tungsten silicide. The silicide nanowires 12 proceed to grow outwardly in all directions from the exterior surfaces 14 of the many electrically conductive microfibers 10. The naturally-forming amorphous nanoshells 20 that encase the titanium silicide or tungsten silicide nanocores 16 are primarily composed of silicon oxide if the alkene gas is not added to the reactive gas mixture 94. If the alkene gas is added, however, the amorphous nanoshells 20 are primarily composed of an inorganic carbon-based mixture of carbon, silicon, and oxygen.

Several operating parameters associated with the growth of the silicide nanowires 12 can be selectively varied to influence their properties. These various parameters may be individually or collectively varied to achieve electrically conductive microfibers 10 with a somewhat customized arrangement of the surface-grown silicide nanowires 12 depending on their expected end-use application.

First, the density of the many silicide nanowires 12 grown on the exterior surfaces 14 of the electrically conductive microfibers 10 can be influenced by the thickness of the deposited thin-film gold layer 32 and the amount of silicon chloride contained in the reactive gas mixture 94. The thickness of the thin-film gold layer 32 and the amount of silicon chloride in the reactive gas mixture 94 are both directly proportional to the density of the silicide nanowires 12.

Second, the length and diameter of the silicide nanowires 12 can be influenced by the thickness of the titanium or tungsten thin-film layer 30, the amount of silicon chloride contained in the reactive gas mixture 94, and the length of time in which the electrically conductive microfibers 10 are exposed to the silicon vapors 36. All three parameters are directly proportional to the length and diameter of the silicide nanowires 12.

Third, the diameter and the morphology of the nanowires 12 can be influenced by the presence and location of the titanium or tungsten powder sample 106 in the deposition chamber 84. The presence of the titanium or tungsten powder sample 106 in close proximity to the electrically conductive microfibers 10, as compared to not being present, decreases the diameter of the surface grown silicide nanowires 12. Increasing the distance between the titanium or tungsten powder sample 106 and the electrically conductive microfibers 10, as compared to the original close proximity positioning, causes the diameter of the silicide nanowires 12 to increase. At some point the distance between the titanium or tungsten powder sample 106 and the electrically conductive microfibers 10 stops affecting the thickness of the silicide nanowires 12 and, instead, causes the very small branched tentacles 22 measuring several angstrons to several nanometers in diameter and several nanometers to several tens of nanometers in length to form transversely on the surfaces of the silicide nanowires 12.

Fourth, as already alluded to, the composition of the nanoshells can be influenced by the contents of the reactive gas mixture 94. The inclusion of the alkene gas, preferably ethylene, into the reactive gas mixture converts the composition of the amorphous nanoshells 20 from silicon oxide to an inorganic carbon-based mixture of carbon, silicon, and oxygen. The nanoshells may also be significantly stripped or altogether removed from the titanium silicide or tungsten silicide nanocore by etching in hydrofluoric acid or some other suitable corrosive acid.

EXAMPLE

This example describes a specific process by which an arrangement of titanium silicide-based nanowires was grown on the surfaces of many individual carbon microfibers. Tungsten-based silicide nanowires could have been grown by simply depositing tungsten on the exterior surfaces of the carbon microfibers instead of titanium during the magnetron sputtering portion of the process. The same general observations and data trends that are discussed below for the titanium-silicide base nanowires would also be expected for the tungsten-based silicide nanowires.

A commercially-available carbon paper comprised of a large quantity of carbon microfibers measuring 5 μm to 10 μm in diameter was obtained from E-TEK, a division of De Nora North America (Somerset, N.J.). A thin-film layer of pure titanium was deposited onto the surfaces of the carbon microfibers to a thickness of about 1 μm. The deposition of the titanium layer was accomplished by radio frequency (RF mode) magnetron sputtering using a titanium target (purity≥99.99%). The inert gas used to form the plasma region around the titanium target was high purity argon (purity≥99.999%). The pressure in the sputtering chamber was maintained at $4.6 \times 10^{-3}$ Torr during the titanium sputtering process. Next, a thin-film layer of pure gold was deposited onto the thin-film titanium layer to a thickness of about 5 nm. The same magnetron sputtering process was used to deposit thin-film gold layer except a gold target (purity≥99.9%) was activated instead of the titanium target.

The Ti/Au coated carbon paper was then transferred into the middle portion of a horizontally-mounted quartz tube reactor surrounded by a furnace. A flow of high purity argon (≥99.999%) was passed through the reactor for 20 minutes at a rate of about 400 sccm (standard cubic centimeters per minute) to purge the reactor of oxygen. After the purging step, a reactive gas mixture containing argon, hydrogen, and silicon chloride was continuously communicated through the quartz tube reactor. The reactive gas mixture comprised about 220 sccm argon and about 180 sccm hydrogen. The silicon chloride was introduced into the reactive gas mixture by diverting about 1 to about 2 sccm of the argon flow through a container filled with a liquid silicon chloride solution having a purity of greater than 99%. The properties of the silicon chloride solution are shown below in Table 1.

TABLE 1

| Silicon chloride (SiCl4) liquid solution properties | |
|---|---|
| Vapor density vs air | 5.86 |
| Vapor pressure at 3° C. | 420 mmHg |
| Assay | 99% |
| Boiling point | 57.6° C. |
| Melting point | −70° C. |
| Density at 25° C. | 1.48 g/mL |

The furnace was then heated to 750° C., at a rate of about 50° C. per hour, and maintained at that temperature for approximately 5 hours. The vast arrangements of titanium silicide-based nanowires (each which included an elongated titanium silicide nanocore and a silicon oxide nanoshell) were grown on the exterior surfaces of the many individual carbon microfibers at this time. Afterwards, the furnace was shut down and the silicon chloride and hydrogen gas feeds to the quartz tube reactor were terminated. The flow of argon through the reactor was maintained until the temperature of the reactor cooled to room temperature.

Figure 5A:
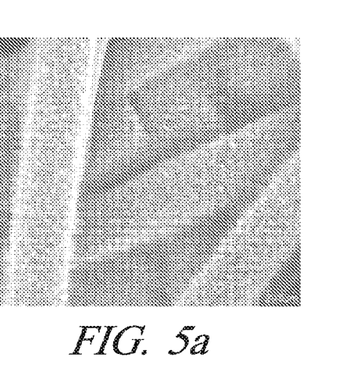
FIGS. 5a-5d show several scanning electron microscope images, at different magnifications, of titanium silicide-based nanowires grown on the surfaces of carbon microfibers according to specifically disclosed example.
Figure 5B:
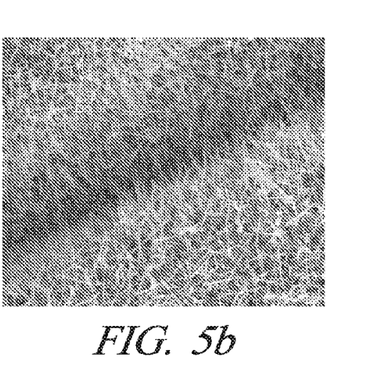
Figure 5C:
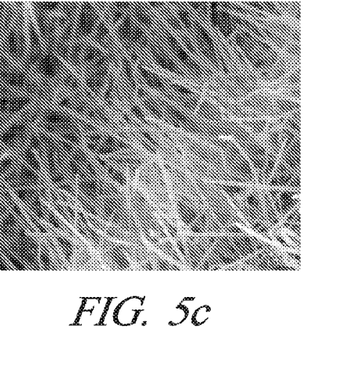
Figure 5D:
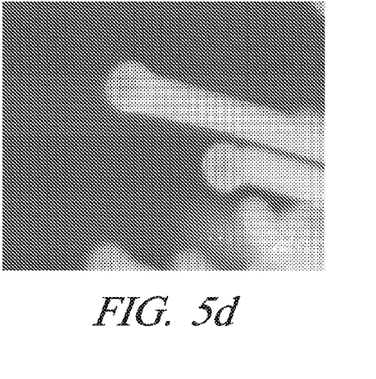

FIGS. 5a-5d show scanning electron microscope (SEM) images of the surface-grown titanium silicide-based nanowires at several different magnifications. The SEM images were generated by a Hitachi S-4800 field scanning electron microscope. The relatively low-magnification image of FIG. 5a depicts the uniform and well-dispersed growth of the nanowires along the surfaces of several of the carbon microfibers. The higher magnification images of FIGS. 5b-5c show, more closely, the dense coverage of the nanowires over the surfaces of the carbon microfibers and provide a visual indication of their ability to ensnare and engage one another. The highest magnification image of FIG. 5d shows a close-up image of two surface-grown nanowires (perhaps more clearly shown in FIG. 6a). This particular image reveals the co-axial structure of the nanowires and the presence of a gold catalyst particle at the tip of the encased nanocores. The many surface-grown nanowires appear to have diameters ranging from about 40 nm to about 80 nm and lengths ranging from about 2 μm to about 3 μm.

Figure 6A:
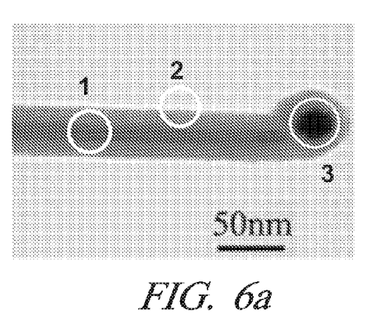
FIG. 6a shows a TEM image of a single titanium silicide-based nanowire of about 40 nm in diameter. The TEM image depicts the co-axial structure of the nanowire including the titanium silicide nanocore (outlined by circle "1"), the terminal gold particle (outlined by circle "3"), and the surrounding silicon oxide nanoshell (outlined by circle "2").
Figure 6B:
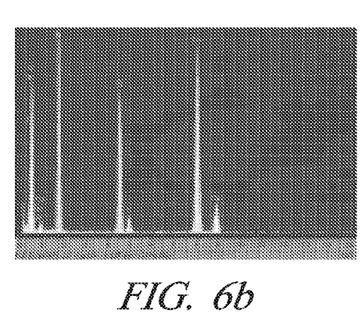
FIG. 6b is the EDX spectrum derived from the nanocore area (circle "1").
Figure 6C:
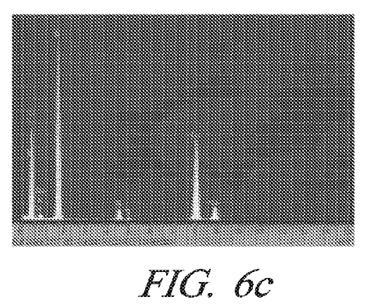
FIG. 6c is the EDX spectrum derived from the nanoshell area (circle "2").
Figure 6D:
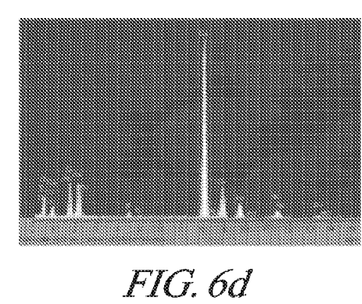
FIG. 6d is the EDX spectrum of the gold particle (circle "3") located at the tip of the nanocore.

FIG. 6a shows a low magnification transmission electron microscope (TEM) image of a single titanium silicide-based nanowire of about 40 nm in diameter. This TEM image depicts the co-axial structure of the nanowire including the titanium silicide nanocore (outlined by circle "1"), the terminal gold particle (outlined by circle "3"), and the surrounding silicon oxide nanoshell (outlined by circle "2"). The TEM image was produced by a JEOL 2010 FEG transmission electron microscope at 200 kV. FIGS. 6b-6d show the compositional characterization of various portions of the titanium silicide-based nanowire using energy dispersive X-ray spectroscopy (EDX). FIG. 6b is the EDX spectrum derived from the nanocore area (circle "1"). Titanium, silicon, and oxygen signals were exclusively detected (mostly titanium and silicon) once the copper signals from the TEM grid were discounted. FIG. 6c is the EDX spectrum derived from the nanoshell area (circle "2"). There, silicon and oxygen signals dominated the spectrum (again discounting the copper signals) indicating the presence of a silicon oxide-rich nanoshell.

Finally, FIG. 6d shows the EDX spectrum of the gold particle (circle "3") located at the tip of the nanocore. Gold signals dominated this spectrum while signals for titanium, silicon, and oxygen were also detected once the copper signals were discounted. The EDX spectra data was generated by an Oxford INCA energy dispersive X-ray spectroscope.

The nanowires were also subjected to X-ray diffraction (XRD) and selected area electron diffraction (SAED) to further characterize their composition. The XRD analysis was performed with a Bruker D8 micro X-ray diffractometer and the SAED analysis was performed by the same JEOL 2010 FEG transmission electron microscope that was used to produce the TEM images of FIGS. 5a-5d. The XRD analysis identified two sets of diffraction peaks besides the peaks of the carbon microfibers. One set of peaks corresponded to $Ti_5Si_3$ and the other set of peaks corresponded to gold. The SAED analysis revealed crystalline diffraction spots and a broader diffraction ring that, respectively, demonstrated the co-existence of crystalline and amorphous structures. The diffraction pattern of the crystalline structure can be indexed to the (002), (410) planes of hexagonal $Ti_5Si_3$.

Figure 7A:
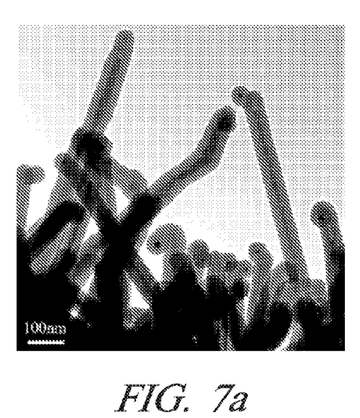
FIGS. 7a-7b show TEM images of several of the titanium silicide-based nanowires originally shown in FIGS. 5a-5d before and after the nanowires were immersed in a 10% hydrofluoric acid solution for 180 seconds, respectively.
Figure 7B:
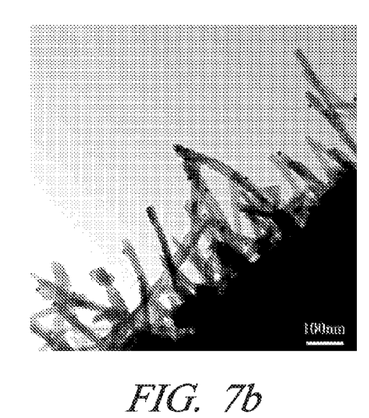
Figure 8:
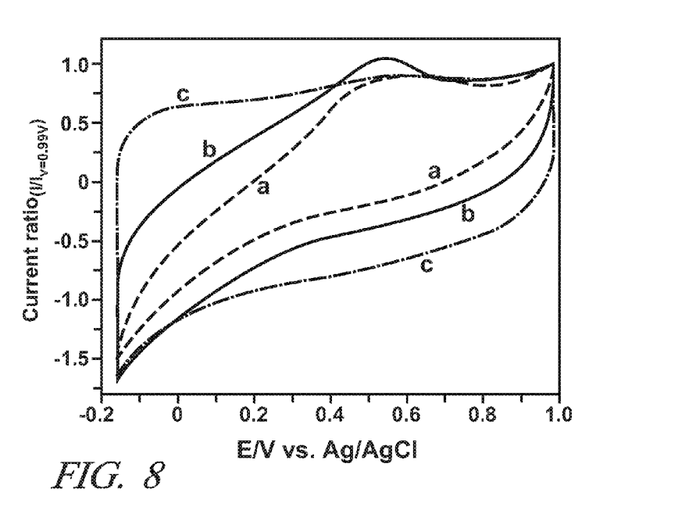
FIG. 8 shows the normalized cyclic voltammograms of several of the titanium silicide-based nanowires originally shown in FIGS. 5a-5d after being etched in a 10% hydrofluoric acid solution for 0 seconds, 120 seconds, and 180 seconds. Line "a" represents the voltammetric curve at 0 seconds, line "b" represents the voltammetric curve at 120 seconds, and line "c" represents the voltammetric curve at 180 seconds.

FIGS. 7a-7b show TEM images of several titanium silicide-based nanowires before and after the nanowires were immersed in 10% hydrofluoric acid solution for 180 seconds, respectively. These images clearly show that etching in HF removes most or all of the silicon oxide nanoshells from the many individual nanowires. FIG. 8 shows normalized cyclic voltammograms of the etched titanium silicide-based nanowires after 0 seconds, 120 seconds, and 180 seconds. Line "a" represents the voltammetric curve at 0 seconds, line "b" represents the voltammetric curve at 120 seconds, and line "c" represents the voltammetric curve at 180 seconds. These voltammetric curves indicate that the electrochemical capacitance of the titanium silicide-based nanowires increases with the thinning of the silicon oxide nanoshells. Moreover, after 180 seconds of etching and substantially complete removal of the nanoshells, the voltammetric curve approaches the rectangular shape that indicates ideal capacitance behavior at relatively high scan speeds of 50 $mVs^{-1}$.

Figure 9A:
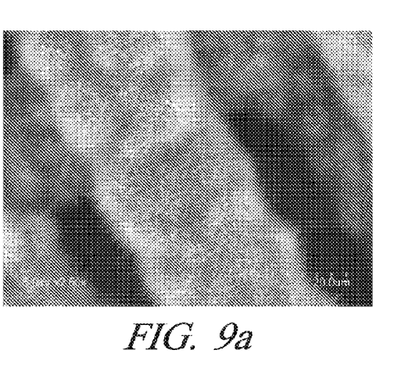
FIGS. 9a-9d show several SEM images of titanium silicide-based nanowires that were grown according to a specifically disclosed example in which a titanium powder particle sample was positioned at two different distances upstream of Ti/Au coated carbon microfibers during the low pressure chemical vapor deposition process.
Figure 9B:
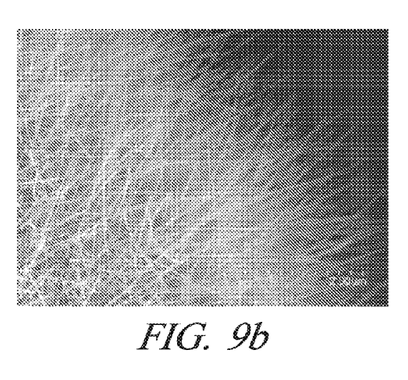
Figure 9C:
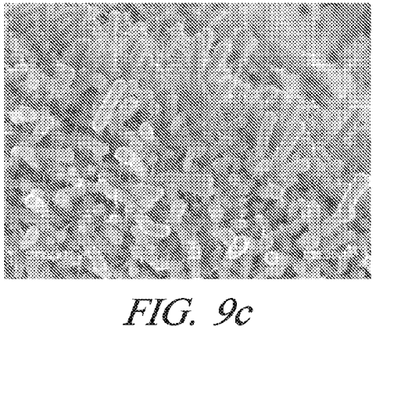
Figure 9D:
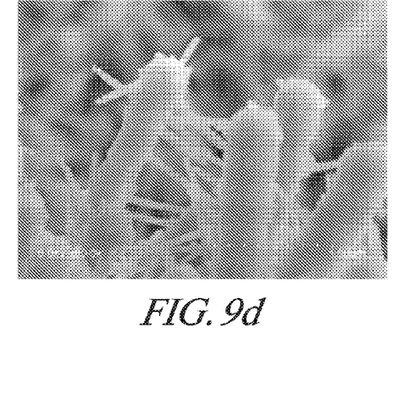

FIGS. 9a-9d show SEM images of the titanium silicide-based nanowires that were obtained after a titanium powder particle sample was positioned at two different distances upstream of the Ti/Au coated carbon microfibers during the low pressure chemical vapor deposition process. FIGS. 9a-9b show the nanowires that were produced when the titanium powder particle sample was placed about 1 cm upstream from the Ti/Au coated carbon microfibers. FIGS. 9c-9d show the nanowires that were produced when the titanium powder particle sample was moved back from the Ti/Au coated carbon microfibers to about 2 cm. The placement of the titanium powder particle sample at a distance of 1 cm in front of the Ti/Au coated carbon microfibers provided the nanowires with a diameter of about 30 nm. With 2 cm between the titanium powder particle sample and the Ti/Au coated carbon microfibers, the morphology of the nanowires changed. The growth of small, branched tentacles that stem transversely from the surfaces of the nanowires, as shown in FIGS. 9c-9d, was observed.

The above description of exemplary embodiments and specific examples are merely descriptive in nature and not intended to limit the scope of the claims that follow.

The invention claimed is:

1. A method of forming an arrangement of outwardly protruding nanowires, which include titanium silicide or tungsten silicide, on the exterior surfaces of electrically conductive microfibers, the method comprising:

depositing a thin-film layer of titanium or tungsten to a thickness of about 500 nm to about 2 μm onto exterior surfaces electrically conductive microfibers;

depositing a thin-film layer of gold to a thickness of about 1 nm to about 10 nm onto the thin-film layers of titanium or tungsten previously deposited onto the exterior surfaces of the electrically conductive microfibers; and exposing the electrically conductive microfibers with their overlying thin-film layers of titanium or Tungsten and gold to silicon vapors in an inert environment that is maintained at atmospheric pressure or below and a temperature that ranges from about 600° C. to about 900° C. to catalytically grow an arrangement of many outwardly protruding nanowires along the length and circumference of the exterior surfaces of the electrically conductive microfibers where the thin-film layer of titanium or tungsten and the thin-film layer of gold have been deposited, each of the nanowires being defined by an elongated, centralized nanocore that terminates in a distally spaced gold particle and an amorphous nanoshell that encases the nanocore and the gold particle, the nanocore being composed of titanium silicide, if titanium is deposited onto the exterior surfaces of the electrically conductive microfibers, or tungsten silicide, if tungsten is deposited onto the exterior surfaces of the electrically conductive microfibers.

2. The method set forth in claim 1, wherein the electrically conductive microfibers are defined by a length that ranges from about 10 μm to about 2 mm and a diameter that ranges from about 1 μm to about 50 μm, and wherein each of the nanowires has substantially the same length and diameter of about 1 μm to about 10 μm and about 20 nm to about 100 nm, respectively.

3. The method set forth in claim 1, wherein the thin-film layers of titanium or tungsten deposited onto the exterior surfaces of the electrically conductive microfibers are sputtered from a titanium or tungsten target that is negatively-charged in the presence of argon at a pressure that ranges from about $2.5 \times 10^{-3}$ Torr to about $8.0 \times 10^{-3}$ Torr.

4. The method set forth in claim 1, wherein the thin-film layers of gold deposited onto the thin-film layers of titanium or tungsten are sputtered from a gold target that is negatively-charged in the presence of argon at a pressure that ranges from about $2.5 \times 10^{-3}$ Torr to about $8.0 \times 10^{-3}$ Torr.

5. The method set forth in claim 1, wherein the electrically conductive microfibers with their overlying thin-film layers of titanium or tungsten and gold are exposed to the silicon vapors in a deposition chamber surrounded by a heating element, the silicon vapors being derived from a reactive gas mixture that includes amounts of an inert gas, hydrogen, and silicon chloride.

6. The method set forth in claim 5, wherein the amorphous nanoshells that encase the elongated, centralized nanocores and gold particles are composed primarily of silicon oxide.

7. The method set forth in claim 5, wherein the reactive gas mixture further comprises an amount of an alkene gas, and wherein the amorphous nanoshells that encase the elongated, centralized nanocores and gold particles are composed primarily of an inorganic carbon-based mixture of carbon, silicon, and oxygen.

8. The method set forth in claim 7, wherein the alkene gas is ethylene.

9. The method set forth in claim 5, wherein the reactive gas mixture further comprises suspended powder particles of either titanium or tungsten, whichever corresponds to the composition of the thin-film layer of titanium or tungsten.

10. The method set forth in claim 9, wherein a titanium or tungsten powder particle sample is positioned within the deposition chamber at a distance upstream from the electrically conductive microfibers to introduce the titanium or tungsten powder particles into the reactive gas mixture and to induce the formation of branched tentacles that stem transversely from the nanowires, the branched tentacles being compositionally the same as the nanowires from which they are grown.

11. The method set forth in claim 1, further comprising etching the arrangement of outwardly protruding nanowires in a corrosive acid to remove the amorphous nanoshells.

12. A method of forming an arrangement of outwardly protruding nanowires, which include titanium silicide, on the exterior surfaces of carbon microfibers, the method comprising depositing a thin-film layer of titanium to a Thickness of about 500 nm to about 2 μm onto exterior surfaces of carbon microfibers, the carbon microfibers being defined by a length that ranges from about 10 μm to about 2 mm and a diameter that ranges from about 1 μm to about 50 μm;

depositing a thin-film layer of gold to a thickness of about 1 nm to about 10 nm onto the thin-film layers of titanium previously deposited onto the exterior surfaces of the carbon microfibers;

positioning the carbon microfibers with their overlying thin-film layers of titanium and gold into a deposition chamber of a low pressure chemical vapor deposition assembly that is maintained at atmospheric pressure or below;

heating the deposition chamber to a temperature that ranges from about 600° C. to about 900° C.;

introducing a reactive gas mixture into the deposition chamber that comprises amounts of an inert gas, silicon chloride, and hydrogen to produce a desired quantity of silicon vapors;

communicating the reactive gas mixture through the deposition chamber and into reactive interaction with the carbon microfibers, which have previously been deposited with the thin-film layers of titanium and gold, for a period of time sufficient to catalytically grow an arrangement of many outwardly protruding nanowires along the length and circumference of the exterior surfaces of the carbon microfibers where the thin-film layers of titanium and gold have been deposited, each of the nanowires being defined by an elongated, centralized nanocore that terminates in a distally spaced gold particle and an amorphous nanoshell that encases the nanocore and the gold particle, the nanocore being composed of titanium silicide and the nanoshell being composed of silicon oxide or an inorganic carbon-based mixture of carbon, silicon, and oxygen, and wherein each of the nanowires has substantially the same length and diameter of about 1 μm to about 10 μm and about 20 nm to about 100 nm, respectively.

13. The method set forth in claim 12, wherein the reactive gas mixture comprises, per about 400 sccm, about 200 to about 240 sccm argon, about 160 to about 200 sccm hydrogen, and wherein up to about 3 vol. % of the argon flow is diverted through a liquid silicon chloride solution of 99% parity or greater.

14. The method set forth in claim 12, wherein the thin-film layers of titanium are sputtered from a titanium target that is negatively-charged in the presence of argon at a pressure that ranges from about $2.5 \times 10^{-3}$ Torr to about $8.0 \times 10^{-3}$ Torr.

15. The method set forth in claim 12, wherein the thin-film layers of gold are sputtered from a gold target that is negatively-charged in the presence of argon at a pressure that ranges from about $2.5 \times 10^{-3}$ Torr to about $8.0 \times 10^{-3}$ Torr.

16. The method set forth in claim 12, wherein the reactive gas mixture further comprises an amount of ethylene, and wherein the amorphous nanoshells that encase the elongated, centralized nanocores and gold particles are composed primarily of an inorganic carbon-based mixture of carbon, silicon, and oxygen.

17. The method set forth in claim 12, wherein a titanium powder particle sample is positioned within the deposition chamber at a distance upstream from the carbon microfibers to introduce titanium powder particles into the reactive gas mixture and to induce the formation of branched tentacles that stem transversely from the nanowires, the branched tentacles being compositionally the same as the nanowires from which they are grown.

18. The method set forth in claim 12, further comprising etching the arrangement of outwardly protruding nanowires in a corrosive acid to remove the amorphous nanoshells.

\* \* \* \* \*